(12) United States Patent
Bernard et al.

(10) Patent No.: US 6,594,615 B2
(45) Date of Patent: Jul. 15, 2003

(54) LEARNING PROXIMITY DETECTOR

(75) Inventors: Jacques Bernard, L'Isle d'Espagnac (FR); Christophe Brault, Touvres (FR)

(73) Assignee: Schneider Electric Industries SA, Rueil-Malmaison (FR)

( * ) Notice: Subject to any disclaimer, the term of this patent is extended or adjusted under 35 U.S.C. 154(b) by 169 days.

(21) Appl. No.: 09/822,346

(22) Filed: Apr. 2, 2001

(65) Prior Publication Data

US 2002/0045998 A1 Apr. 18, 2002

(30) Foreign Application Priority Data

Mar. 31, 2000 (FR) .............................. 00 04245

(51) Int. Cl.[7] .................. G01C 17/00; G01C 19/00; G01C 9/00
(52) U.S. Cl. .................................... 702/150
(58) Field of Search .................. 702/150, 88, 94; 324/207.16, 207.26, 207.2; 331/65

(56) References Cited

U.S. PATENT DOCUMENTS

| | | | | |
|---|---|---|---|---|
| 3,872,398 A | * | 3/1975 | Fausone et al. ............... | 331/65 |
| 4,299,496 A | * | 11/1981 | Lord ........................... | 356/446 |
| 4,502,042 A | * | 2/1985 | Wuhrl et al. .................. | 340/561 |
| 4,894,527 A | * | 1/1990 | Smith .................... | 250/214 AL |
| 5,103,085 A | * | 4/1992 | Zimmerman ................ | 250/221 |
| 5,367,198 A | * | 11/1994 | Buergel et al. ............. | 307/116 |
| 5,410,488 A | * | 4/1995 | Andersen, III .............. | 702/158 |
| 5,463,333 A | * | 10/1995 | Calder et al. ................. | 327/78 |
| 5,651,044 A | * | 7/1997 | Klotz, Jr. et al. ............. | 378/17 |
| 5,818,129 A | | 10/1998 | Fericean et al. | |
| 5,895,441 A | * | 4/1999 | Brault et al. .................. | 702/85 |
| 6,011,467 A | * | 1/2000 | Kamei et al. ............... | 340/540 |
| 6,198,963 B1 | * | 3/2001 | Haim et al. ................. | 600/424 |
| 6,208,134 B1 | * | 3/2001 | Demma ................. | 324/207.26 |
| 6,265,709 B1 | * | 7/2001 | Olson et al. ................ | 250/221 |
| 6,446,012 B1 | * | 9/2002 | Macke, Sr. et al. ........... | 702/22 |

FOREIGN PATENT DOCUMENTS

| | | |
|---|---|---|
| DE | 40 06 893 A | 9/1991 |
| DE | 43 31 555 A | 3/1994 |

\* cited by examiner

*Primary Examiner*—John Barlow
*Assistant Examiner*—Demetrius R. Pretlow
(74) *Attorney, Agent, or Firm*—Oblon, Spivak, McClelland, Maier & Neustadt, P.C.

(57) ABSTRACT

A self-adaptable proximity detector delivering a binary output signal for the presence or absence of a target. The proximity detector includes a processing unit and operates according to a short learning mode for an adjustment relative to its environment, according to a long learning mode for an adjustment relative to its environment and to a target, and according to a working mode corresponding to normal operation. The proximity detector also includes a variable digital storage resistor driven by the processing unit in the learning mode and connected to the detection stage so that variation of the value of the digital resistor causes a variation of the switching threshold. In the working mode, the processing unit is in a standby state and the variable digital storage resistor remains at its set operating value.

22 Claims, 2 Drawing Sheets

LEARNING PROXIMITY DETECTOR

Figure 1:
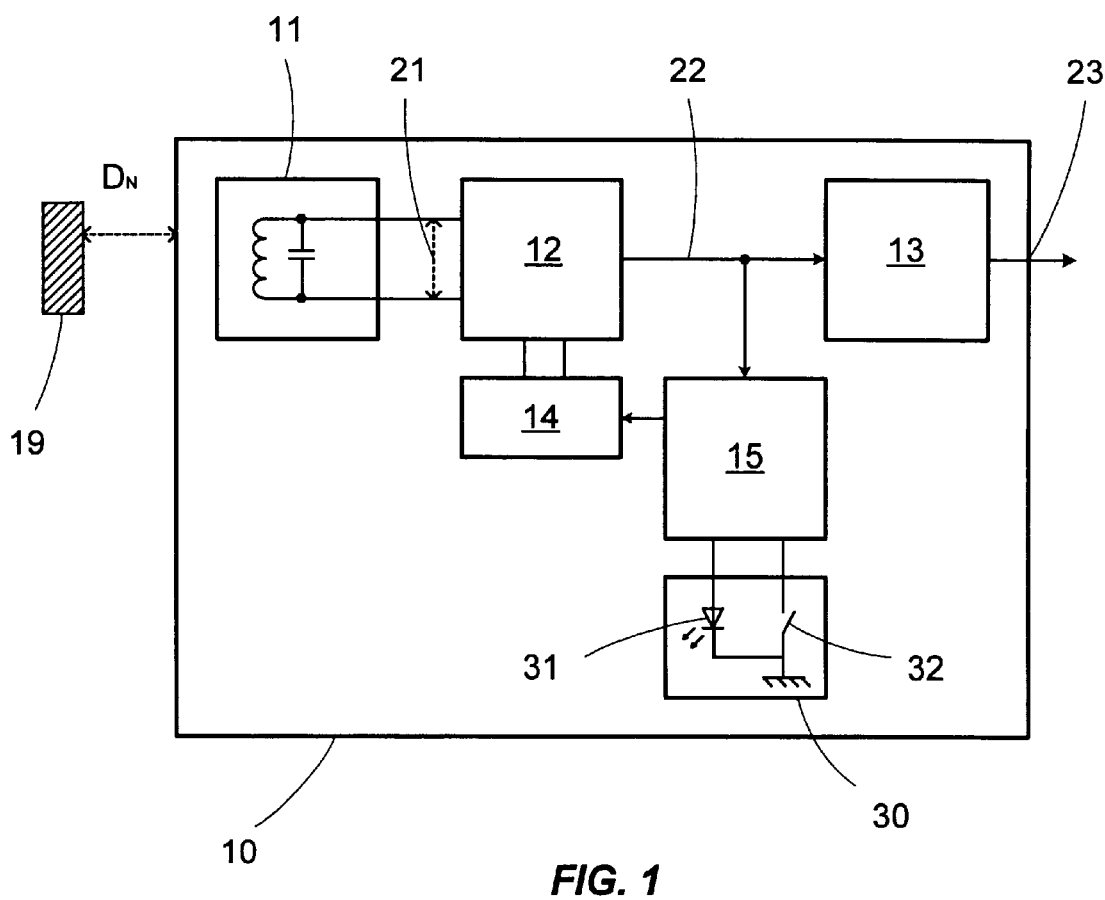

The present invention relates to a learning proximity detector, for example of the inductive type, delivering a binary output signal for the presence or absence of a target and having a learning mode in order to achieve self-adaptation of the detector's range relatively to a target and relatively to an environment.

The detection distance specific to such a device varies from one detector to another and, for a same detector, varies according to the mounting and environmental conditions, in particular for an inductive detector embedded in a metal mass. Furthermore, certain applications require that the sensitivity of the detector may be changed depending on its use. It is therefore useful to be able to adjust the range of a proximity detector on its location of use.

Detectors having a learning mode during which the detector is adjusted, in addition to a working mode corresponding to the normal operating mode of the detector, are already known (see document EP 0740716). In DE 4331555, it has also been suggested that a proximity detector be adjusted by using a processing unit to which is connected a non-volatile memory which, in a learning phase triggered by a sampling signal, stores a switching threshold determined from the comparison between the value of an internal counter and the value of the detection signal from the sensor. Moreover, in document DE 4006893, the adjustment component of the proximity detector consists of a nonvolatile memory which drives several resistive elements by means of a digital word, wherein the direction of variation of this memory may only be determined through the action of an operator.

The object of the invention is to design a proximity detector capable of adjusting the detection range not only according to a type of target to be detected but also according to the general environment of the detector, so that it may automatically and rapidly adapt to different multiple uses. Too large electrical power consumption from the detector in the working mode should also be prevented as desired, notably so that the acceptable leak current is not exceeded, especially for proximity detectors with an output of the two-wire type. This implies that the detector should be capable of operating in the working mode without excessive consumption related to the processing unit and without storing the switching threshold from the learning mode in a memory connected to the processing unit. Also, during the learning mode, the possibility of the operator sending instructions to the detector and also receiving feedback information indicating the current state of the detector, is of interest, altogether while retaining a simple and economical solution. Finally, it is desired that solutions be used which provides for far-reaching miniaturization of the detector.

For this, the invention describes a proximity detector comprising a sensor unit capable of delivering an analog signal according to the distance of a target, a detection stage capable of delivering a detection signal resulting from the comparison between the analog signal and a switching threshold, an output stage for amplifying and shaping the detection signal in order to deliver the detector's output signal, and a processing unit receiving the detection signal as an input. The detector is designed for operation according to a learning mode corresponding to the adjustment of the detector's range and according to a working mode corresponding to the normal operating mode of the detector. It is characterized by the fact that the detector comprises a variable digital storage resistor, driven by the processing unit and connected to the detection stage so that variation of the value of this variable digital storage resistor causes a variation of the switching threshold. During the learning mode, the processing unit acts, depending on the state of the detection signal, on the value of the variable digital storage resistor in order to determine a set operating value for the variable digital storage resistor, wherein this set operating value is applied during the working mode. During the working mode, the processing unit is in a standby state.

Moreover, the detector comprises conversing means connected to the processing unit, notably so that the learning mode or the working mode may be selected by an operator and also that the operator may be informed on the state of the detector.

The learning mode for the detector either comprises a short learning mode wherein teaching of the detector is only performed relatively to its environment, or a long learning mode wherein teaching of the detector is performed relatively to its environment and relatively to a target placed at a distance from the detector.

The following description of a non-limiting embodiment, with reference to the appended drawings, illustrates the features and advantages of the invention.

Figure 2:
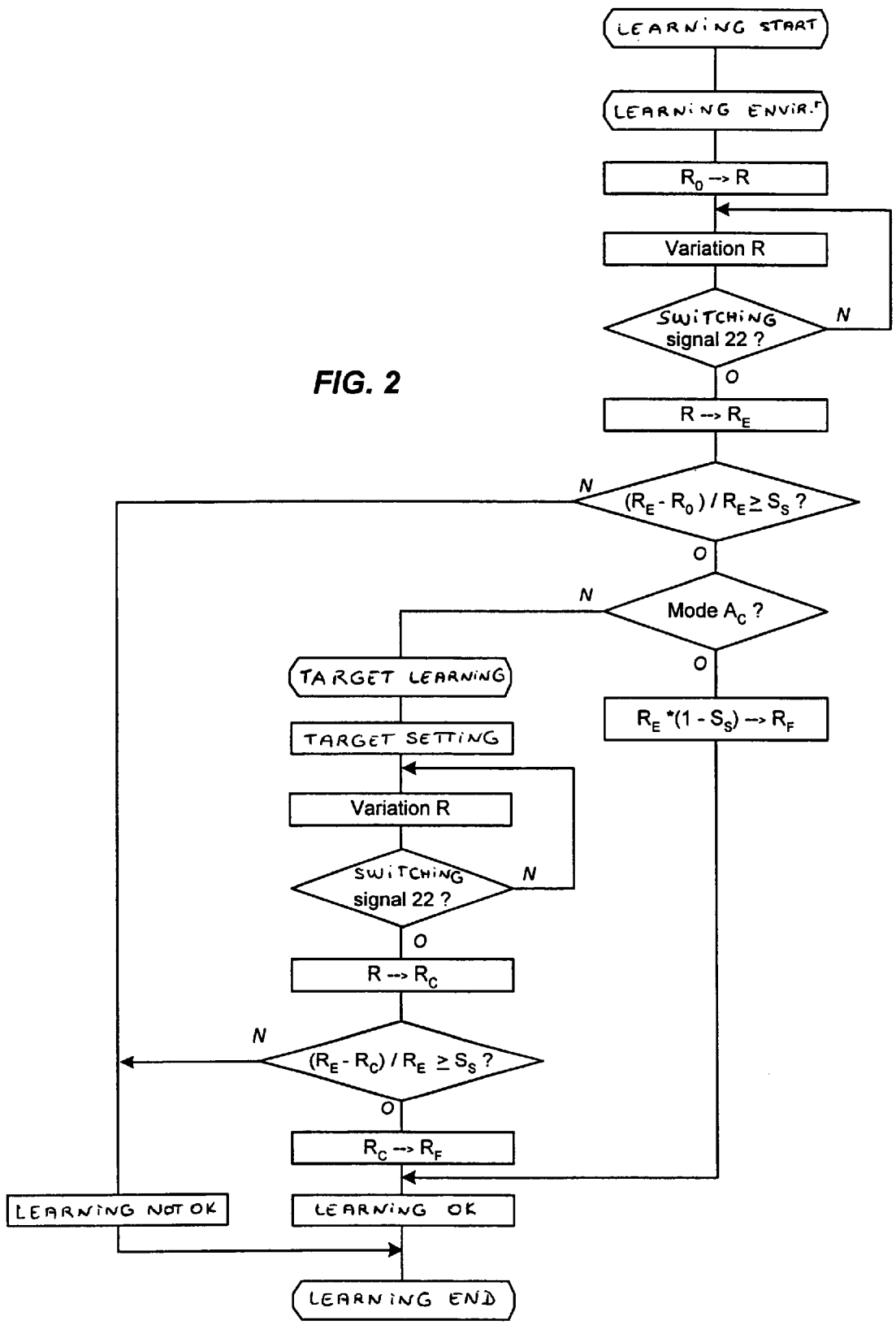

FIG. 1 shows the architecture of a proximity detector according to the invention, FIG. 2 represents a simplified flowchart describing the course of the learning mode for the detector.

The proximity detector illustrated in FIG. 1 comprises in a casing 10, a sensor unit 11, for example of the inductive type, which delivers an analog signal 21 according to the distance of a target 19, for example a metal target, in front of detector 10. A detection stage 12 receives the analog signal 21 emitted by the sensor unit 11 and compares it with a switching threshold $S_C$ in order to deliver a binary detection signal 22, resulting from this comparison.

Detector 10 comprises an output stage 13 receiving as input the detection signal 22 and the role of which is to amplify and shape this signal 22 in order to deliver a binary output signal 23 from detector 10. The output stage 13 may include for example a diode, a thyristor or a MOS transistor. Detector 10 also comprises a processing unit 15, which may advantageously be a microcontroller, a microprocessor, a logic circuit or some other circuit, which receives as input the detection signal 22 and which drives a variable digital storage resistor 14 or potentiometer 14 storing value R. A variable digital storage resistor is defined as a resistor which varies in a digital and not analog way, which is controlled by logic signals and which is capable of storing its adjustment value internally.

The processing unit 15 may notably give orders to the digital variable storage resistor 14, for assigning value R to a predetermined value, orders for incrementing or decrementing value R as well as orders for storing value R. Once the value R is stored, the variable digital storage resistor is autonomous and retains this value R even after a power failure. A variable digital storage resistor notably provides the advantage of occupying less space than several resistive components or a resistor network which provides for more far-reaching miniaturization of the detector. Moreover, once the value R is stored, the variable digital storage resistor operates independently as regards the processing unit.

The variable digital storage resistor 14 is directly connected to the detection stage 12, so that variation of its value R causes a variation of the switching threshold $S_c$. Thus, a variation of the value R of the variable digital storage resistor 14, may cause a state transition of detection signal 22, while the distance between detector 10 and target 19 remains fixed.

On the other hand, conversing means 30 are connected to the processing unit 15 and directly mounted on the detector 10. According to a preferred embodiment, the conversing means 30 only consist of a light emitting diode 31 driven by the processing unit 15 and a push button 32, of the microswitch type or any another equivalent unit, so as to retain an economical and miniaturized solution for detector 10.

Detector 10 is designed for operation according to a learning mode and a working mode. The learning mode, the purpose of which is to perform an adjustment of the range of the detector, is described hereafter. The working mode is the normal operating mode of detector 10 wherein the state of the output signal 23, for example an open or a closed state, depends on the distance between a target 19 and detector 10.

The transition from the working mode to the learning mode is accomplished by acting on the push button 32 of the conversing means 30. The operator has the choice between two different ways for carrying out the teaching process for detector 10: either a short learning mode $A_C$ wherein the detector 10 is only adjusted relatively to its environment, or a long learning mode $A_L$ wherein detector 10 is adjusted relatively to its environment then relatively to a target 19 placed at a desired distance $D_N$ from the detector. Selection of the learning mode may be provided by applying different pressure on the push button 32.

The significance of the short learning mode $A_C$ is that it performs an adjustment of the maximum acceptable range of detector 10 in the considered environment, for example with a detector mounted on a metal or plastic support. The significance of the long learning mode $A_L$ is that it additionally performs an adjustment of the desired position at which a target will actually be detected. The thereby obtained range may therefore be very short of the maximum acceptable range in the considered environment. With this functionality, it is possible to obtain a learning proximity detector capable of adapting to different configurations automatically, according to the type of target to be detected and to the environment of use, so that the detector's accuracy is thereby optimized.

FIG. 2 gives a simplified flowchart of the course of the learning mode. In the short learning mode $A_C$, as well as in the long learning mode $A_L$, the teaching of detector 10 is first performed relatively to its environment (i.e. to the frame of a machine, to a background, etc . . . ) irrelevantly to any presence of a target 19. For this, the processing unit 15 starts by setting the value R of the variable digital storage resistor 14 to an extreme value $R_0$, for example a minimum value. The processing unit 15 then regularly varies this value R, for example by incrementing it, until the detection signal 22 switches and changes its state. The corresponding value R is then called the environment detection value $R_E$. The processing unit 15 calculates an environmental difference $E_E=(R_E-R_o)/R_E$ and compares it with a sensitivity threshold $S_S$ internal to the processing unit.

If the environmental difference $E_E$ is less than this sensitivity threshold $S_S$, it is considered that the detector 10 does not have a sufficient operating margin for guaranteeing the usual parameters such as compliance with electromagnetic compatibility standards (EMC), small temperature drift, etc . . . In this case, the light emitting diode 31 of the conversing means 30 signals occurrence of a fault, meaning that the learning process could not be accomplished properly (learning not OK) and the processing unit 15 terminates the learning mode.

If the environmental difference $E_E$ is greater or equal to the sensitivity threshold $S_S$ and if the selected learning mode is the short learning mode A, the processing unit 15 calculates a set operating value $R_F$ equal to the environment detection value $R_E$ reduced by the sensitivity threshold $S_S$, $R_F=R_E*(1-S_S)$, then applies this set value $R_F$ to the variable digital storage resistor 14 before terminating the learning mode. The variable digital storage resistor 14 will store this set operating value $R_F$ as long as it does not receive any new order for changing it from the processing unit 15.

If the environmental difference $E_E$ is greater than or equal to the sensitivity threshold $S_S$ and if the selected learning mode is the long learning mode $A_L$, the processing unit 15 asks the operator, by means of diode 31, to set the target 19 at a distance $D_N$ desired by the operator in order to proceed with the learning process of the target. Once the operator has informed the processing unit 15 of the proper positioning of target 19, the processing unit 15 regularly varies the value R of the variable digital storage resistor 14 until the detection signal 22 switches and changes its state. The corresponding value R is then called the target detection value $R_C$. The processing unit 15 calculates a target difference $E_C=(R_E-R_C)/R_E$ and compares it with the internal sensitivity threshold $S_S$.

If the target difference $E_C$ is less than the sensitivity threshold $S_S$, it is considered that the detector 10 does not have a sufficient operating margin for guaranteeing the usual parameters such as compliance with electromagnetic compatibility standards (EMC), small temperature shift, etc . . . In this case, the light emitting diode 31 signals occurrence of a fault meaning that the learning process was not accomplished properly (learning not OK) and the processing unit 15 terminates the learning mode.

If the target difference $E_C$ is greater than or equal to the sensitivity threshold $S_S$, the processing unit 15 calculates a set operating value $R_F$ equal to the target detection value $R_C$, $R_F=R_C$, then applies this set value $R_F$ to the variable digital storage resistor 14 before terminating the learning mode. The variable digital storage resistor 14 will store this set operating value $R_F$ as long as it does not receive a new order for changing it from the processing unit 15.

When the learning process was not accomplished properly (learning not OK), the operator is now directly informed by the light emitting diode 31 that detector 10 is unable to operate properly under the desired adjustment conditions, and consequently that it is not possible to give him the guarantee that the detector will retain all its performances regardless of its environment, of the nature of the target as well as of the requested range.

When the learning process was accomplished properly (learning OK), the detector automatically switches back to working mode. As the variable digital storage resistor 14 is autonomous, and as the set operating value $R_F$ from the learning mode is directly stored in the variable digital storage resistor 14, the detector 10 is then able to operate without using the processing unit 15. This is why, during the entire working mode, the processing unit 15 is in a standby state or in an equivalent state such as in a wait state after an instruction of the "SLEEP" type. Consequently, the detector 10 is prevented from consuming too much electrical power and this therefore avoids the need for a more powerful power supply whilst maintaining a guaranteed low leak current level for the output signal 23. The processing unit 15 switches to the standby state at the end of the learning mode and quits its standby state when an operator actuates the push button 32 suitably in order to switch to learning mode.

Such a proximity detector is thus capable of dissipating a maximum leak current less than or equal to 1.5 mA in working mode under an AC or DC power supply. This low leak current is a substantial advantage which enables the use of a two-wire output technology for the detector.

Equivalently, in order to maintain a maximum leak current, less than or equal to 1.5 mA, in working mode, the electrical power consumption of the processing unit 15 may be minimized by acting on one or more of the following parameters: lowering the clock frequency of the processing unit 15 (for example at a frequency less than 50 kHz), lowering of the power supply voltage of the processing unit 15 (for example at a voltage less than 3 V), putting the processing unit 15 in a standby state in the working mode.

It is clearly understood that other alternatives and detailed enhancements may be devised without departing from the scope of the invention and also the use of equivalent means may be contemplated.

What is claimed is:

1. A proximity detector comprising:
   a sensor device configured to deliver an analog signal according to a distance of a target;
   a detection stage configured to deliver a detection signal resulting from a comparison between the analog signal and a switching threshold;
   an output stage configured to amplify and shape the detection signal and to deliver an output logic signal; and
   a processing unit configured to receive as an input the detection signal,
   wherein the proximity detector operates according to a learning mode corresponding to an adjustment of a range of the proximity detector and according to a working mode corresponding to a normal operating mode of the proximity detector,
   wherein the proximity detector comprises a variable digital storage resistor driven by the processing unit in the learning mode and connected to the detection stage in such a way that a variation of a value of the variable digital storage resistor causes a variation of the switching threshold, and
   wherein the processing unit is in a standby state when the proximity detector is in the working mode to reduce leak-current and to reduce power consumption.

2. The proximity detector according to claim 1, wherein the processing unit varies the value of the variable digital storage resistor until the detection signal switches during the learning mode, for determining a set operating value stored in the variable digital storage resistor and applied during the working mode.

3. The proximity detector according to claim 1, further comprising a conversing unit connected to the processing unit and configured to enable an operator to select one of the learning mode and the working mode and to inform the operator on a state of the proximity detector.

4. The proximity detector according to claim 3, wherein the conversing unit comprises a push button and a light emitting diode directly mounted on the proximity detector.

5. The proximity detector according to claim 3, wherein the learning mode for the proximity detector comprises one of a short learning mode wherein a teaching of the proximity detector is only performed relatively to the environment of the proximity detector, and a long learning mode wherein the teaching of the proximity detector is performed relatively to the environment of the proximity detector and relatively to the target placed at a distance from the proximity detector.

6. The proximity detector according to claim 5, wherein a selection between the short learning mode and the long learning mode is performed through the conversing unit.

7. The proximity detector according to claim 5, wherein the processing unit sets the variable digital storage resistor to an extreme value during the teaching of the proximity detector relatively to the environment of the proximity detector, then varies the variable digital storage resistor up to an environment detection value corresponding to a switching of the detection signal.

8. The proximity detector according to claim 7, wherein the processing unit calculates an environmental difference depending on the environment detection value and on the extreme value, then, if the environmental difference is less than a sensitivity threshold contained in the processing unit, the processing unit signals a fault and the end of the learning mode through the conversing unit.

9. The proximity detector according to claim 8, wherein in the short learning mode, if the environmental difference is greater than or equal to the sensitivity threshold, the processing unit sets the variable digital storage resistor to the set operating value which is equal to the environment detection value reduced by the sensitivity threshold, signals the end of the learning mode through the conversing unit and switches back to the working mode automatically.

10. The proximity detector according to claim 8, wherein in the long learning mode and after having placed the target at the distance from the proximity detector, the processing unit varies the variable digital storage resistor up to a target detection value corresponding to the switching of the detection signal.

11. The proximity detector according to claim 10, wherein in the long learning mode, the processing unit calculates a target difference depending on the target detection value and on the environment detection value, then, if the target difference is less than the sensitivity threshold contained in the processing unit, the processing unit signals the fault through the conversing unit and, if the target difference is greater than or equal to the sensitivity threshold, the processing unit sets the variable digital storage resistor to the set operating value equal to the target detection value, signals the end of the learning mode through the conversing unit and switches back to the working mode automatically.

12. A proximity detector comprising:
    a sensor means for delivering an analog signal according to a distance of a target;
    a detection means for delivering a detection signal resulting from a comparison between the analog signal and a switching threshold;
    an amplifying means for amplifying and shaping the detection signal and for delivering an output logic signal; and
    a processing means that receives as an input the detection signal,
    wherein the proximity detector operates according to a learning mode corresponding to an adjustment of a range of the proximity detector and according to a working mode corresponding to a normal operating mode of the proximity detector,
    wherein the proximity detector comprises a variable digital storage means driven by the processing means in the learning mode and connected to the detection means in such a way that a variation of a value of the variable digital storage means causes a variation of the switching threshold, and
    wherein the processing means is in a standby state when the proximity detector is in the working mode to reduce leak-current and to reduce power consumption.

13. The proximity detector according to claim 12, wherein the processing means varies the value of the variable digital storage means until the detection signal switches during the learning mode, for determining a set operating value stored in the variable digital storage means and applied during the working mode.

14. The proximity detector according to claim 12, further comprising a conversing means connected to the processing means for enabling an operator to select one of the learning mode and the working mode and to inform the operator on a state of the proximity detector.

15. The proximity detector according to claim 14, wherein the conversing means comprises a push button and a light emitting diode directly mounted on the proximity detector.

16. The proximity detector according to claim 14, wherein the learning mode for the proximity detector comprises one of a short learning mode wherein a teaching of the proximity detector is only performed relatively to the environment of the proximity detector, and a long learning mode wherein the teaching of the proximity detector is performed relatively to the environment of the proximity detector and relatively to the target placed at a distance from the proximity detector.

17. The proximity detector according to claim 16, wherein a selection between the short learning mode and the long learning mode is performed through the conversing means.

18. The proximity detector according to claim 16, wherein the processing means sets the variable digital storage means to an extreme value during the teaching of the proximity detector relatively to the environment of the proximity detector, then varies the variable digital storage means up to an environment detection value corresponding to a switching of the detection signal.

19. The proximity detector according to claim 18, wherein the processing means calculates an environmental difference depending on the environment detection value and on the extreme value, then, if the environmental difference is less than a sensitivity threshold contained in the processing means, the processing means signals a fault and the end of the learning mode through the conversing means.

20. The proximity detector according to claim 19, wherein in the short learning mode, if the environmental difference is greater than or equal to the sensitivity threshold, the processing means sets the variable digital storage means to the set operating value which is equal to the environment detection value reduced by the sensitivity threshold, signals the end of the learning mode through the conversing means and switches back to the working mode automatically.

21. The proximity detector according to claim 19, wherein in the long learning mode and after having placed the target at the distance from the proximity detector, the processing means varies the variable digital storage means up to a target detection value corresponding to the switching of the detection signal.

22. The proximity detector according to claim 21, wherein in the long learning mode, the processing means calculates a target difference depending on the target detection value and on the environment detection value, then, if the target difference is less than the sensitivity threshold contained in the processing means, the processing means signals the fault through the conversing means and, if the target difference is greater than or equal to the sensitivity threshold, the processing means sets the variable digital storage means to the set operating value equal to the target detection value, signals the end of the learning mode through the conversing means and switches back to the working mode automatically.

* * * * *